United States Patent
Takahashi et al.

(10) Patent No.: US 7,503,497 B2
(45) Date of Patent: Mar. 17, 2009

(54) DIGITIZING CIRCUIT FOR ANTI-AMBIENT LIGHT NOISE

(75) Inventors: Kentaro Takahashi, Saitama Pref. (JP); Hiroshi Hayakawa, Saitama Pref. (JP)

(73) Assignees: Optoelectronics Co., Ltd., Warabi-shi, Saitama Pref. (JP); Opticon, Inc., Orangeburg, NY (US)

( * ) Notice: Subject to any disclaimer, the term of this patent is extended or adjusted under 35 U.S.C. 154(b) by 0 days.

(21) Appl. No.: 11/449,514

(22) Filed: Jun. 8, 2006

(65) Prior Publication Data

US 2008/0121712 A1    May 29, 2008

(51) Int. Cl.
    *G02B 26/10* (2006.01)
(52) U.S. Cl. .............................. 235/462.27; 235/462.25
(58) Field of Classification Search ............ 235/462.25, 235/462.27; 327/165, 307
See application file for complete search history.

(56) References Cited

U.S. PATENT DOCUMENTS

| 4,517,455 A | 5/1985 | Benitez, III et al. |
| 6,499,662 B1 * | 12/2002 | Coleman et al. ....... 235/462.18 |
| 2006/0083037 A1 | 4/2006 | Leung et al. |

OTHER PUBLICATIONS

International Search Report and Written Opinion of International Application PCT/US2007/7056, filed: Jun. 7, 2007.

* cited by examiner

*Primary Examiner*—Michael G Lee
*Assistant Examiner*—Rafferty Kelly
(74) *Attorney, Agent, or Firm*—Kaplan Gilman & Pergament LLP

(57) ABSTRACT

A system and method of extracting data from a barcode or similar symbol in relatively large ambient light is disclosed. The system uses a slice signal that follows the upper part of a negative offset signal, or the lower part of a positive offset signal, depending upon the value of the input signal. The system may be implemented in digital or analog hardware.

14 Claims, 9 Drawing Sheets

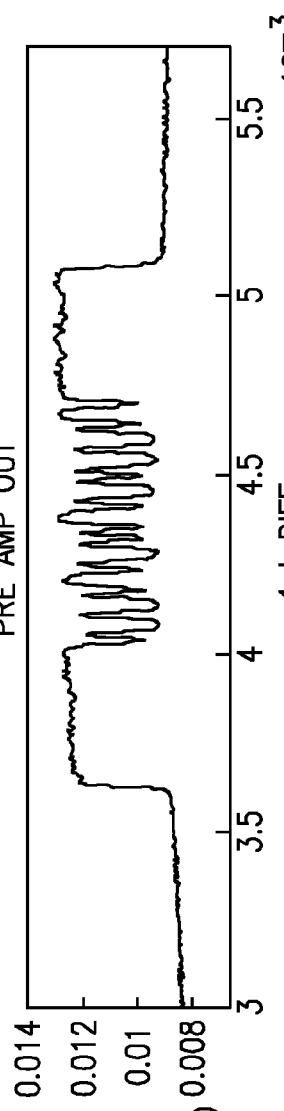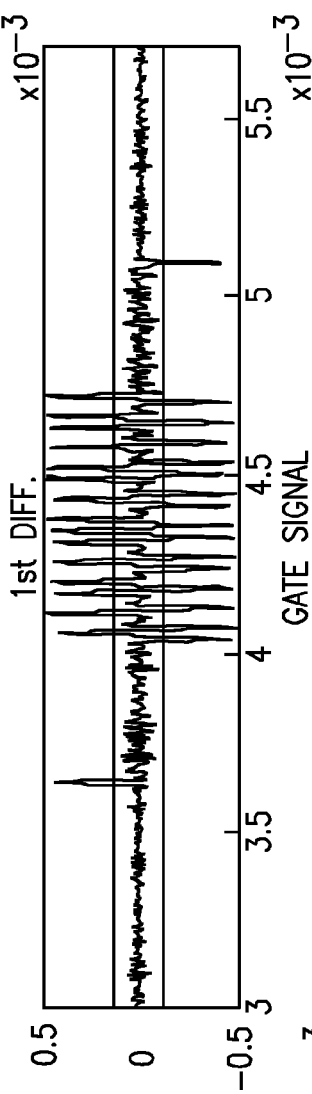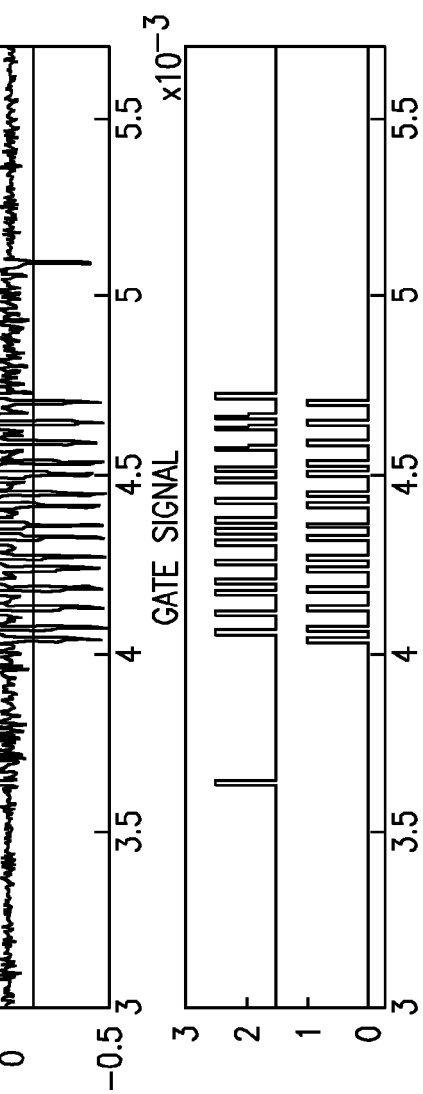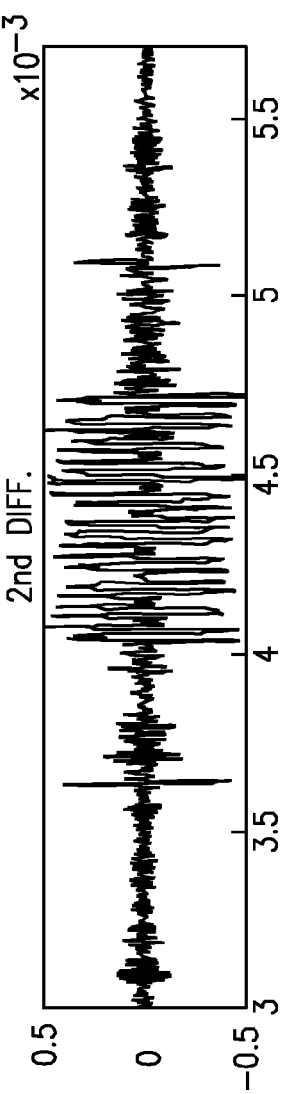

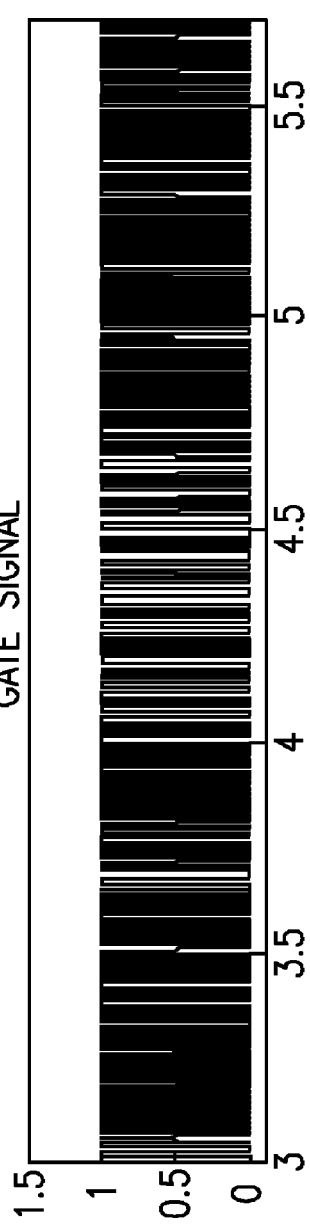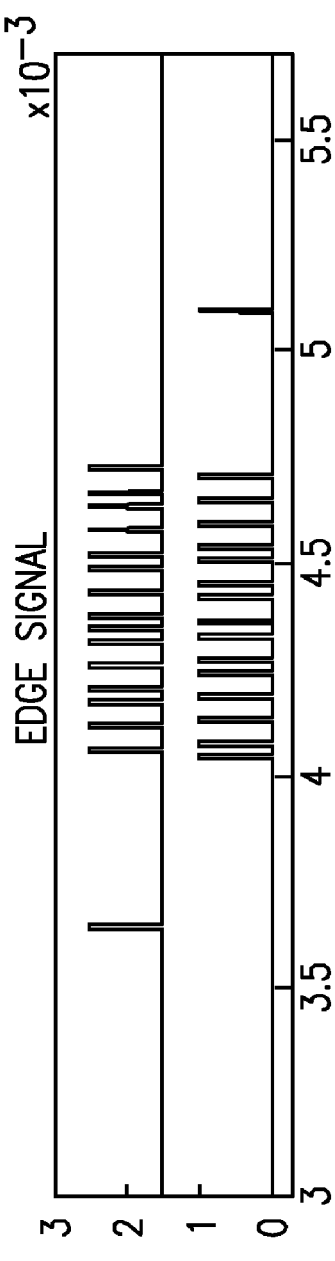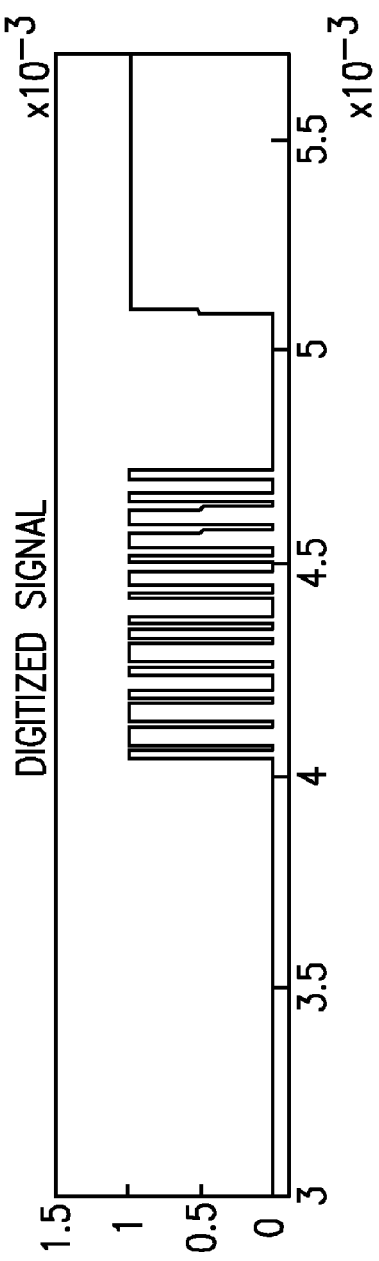

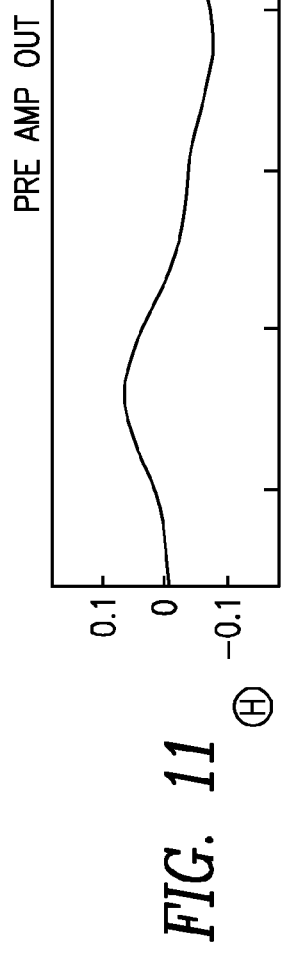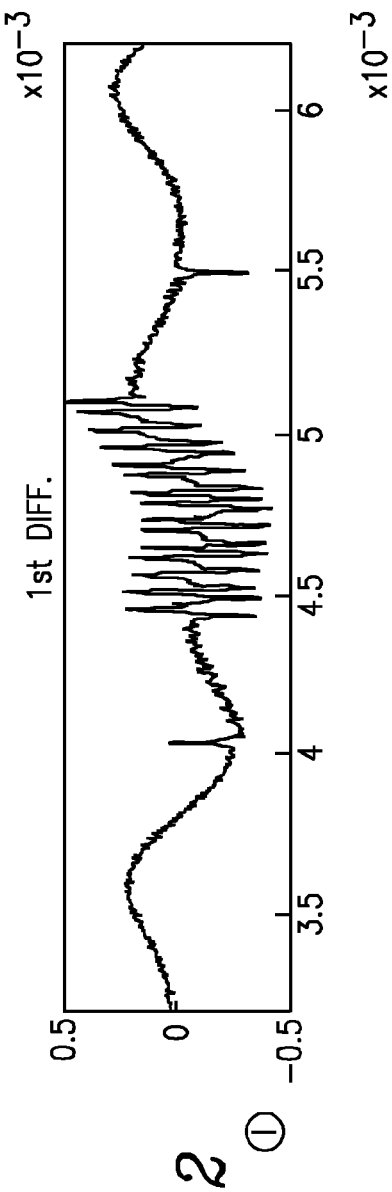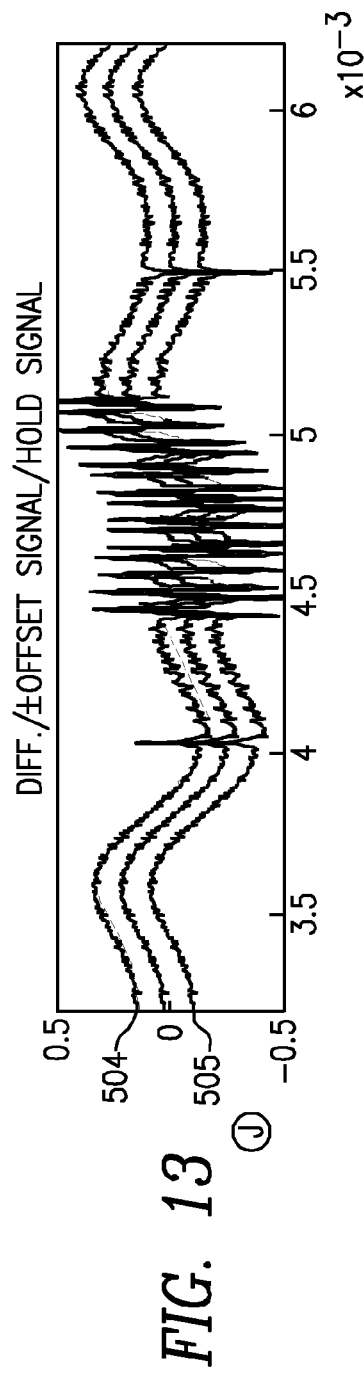
FIG. 11
FIG. 12
FIG. 13

DIGITIZING CIRCUIT FOR ANTI-AMBIENT LIGHT NOISE

TECHNICAL FIELD

This invention relates to optical scanning and detection systems, and has particular application in barcode scanning.

BACKGROUND OF THE INVENTION

In existing barcode scanning systems, a laser beam is scanned over a barcode and the light reflected therefrom is captured and analyzed for information content. The reflected light increases and decreases as the laser scans over light and dark sections of the barcode, respectively. When a barcode scanner operates in an environment with relatively large ambient light, the signal can get lost or distorted by the ambient light. Specifically the ambient light is also amplified by the signal amplifier, which can have a large dynamic range. The ambient light can overshadow the signal, often making it difficult to decode the signal.

One known prior art solution to this is to differentiate the reflected light captured prior to the final amplification. Since the frequency at which the reflected light from the barcode changes is significantly greater than the frequency at which the ambient light increases and decreases, differentiation can reduce the effect of the ambient light. Or, put in another way, the ambient light will have a much lower value of derivative, than the reflected light from the barcode signal.

FIGS. 1 and 2 show a block diagram of an existing digitizer circuit, with FIG. 2 representing the internal components of digitizer 101 of FIG. 1. In the arrangement of FIG. 2, the signal is initially compared with noise elimination levels that are larger than the noise and lower than the barcode signal. These outputs 201 and 202 are then fed to logic gates 203 and 204 while the first differentiated signal received is differentiated again by differentiator 205. The process of the existing digitizer shown in FIG. 2 is demonstrated in FIGS. 3-9, where the wave forms at the output of the various analog and digital components of FIG. 2 are indicated. In the end, FIG. 9 shows that the digitized signal is emitted from a flip flop 210.

Although the above prior technique provides some improvement of performance in environments of strong ambient light, the use of a derivative to reduce the impact of ambient light is often not enough. As a result, the signal can be misread and incorrectly decoded.

In view of the foregoing, there exists a need in the art for a system that can better eliminate the effects of ambient light on the barcode scanning system.

BRIEF DESCRIPTION OF THE DRAWINGS

For the purposes of illustration, and not by way of limitation, the following is represented by the drawings included herewith:

FIG. 3 depicts an exemplary signal at point a of FIG. 1;
FIG. 4 depicts an exemplary signal at point b of FIG. 1;
FIG. 5 depicts an exemplary signal at point c of FIG. 2;
FIG. 6 depicts an exemplary signal at point d of FIG. 2;
FIG. 7 depicts an exemplary signal at point e of FIG. 2;
FIG. 8 depicts an exemplary signal at point f of FIG. 2;
FIG. 9 depicts and exemplary signal at point g of FIG. 2;
FIG. 11 depicts an exemplary signal at point h of FIG. 1;
FIG. 12 depicts and exemplary signal at point i of FIG. 10;
FIG. 13 depicts exemplary signals at point j of FIG. 10.

DETAILED DESCRIPTION OF THE PREFERRED EMBODIMENT

Figure 1:
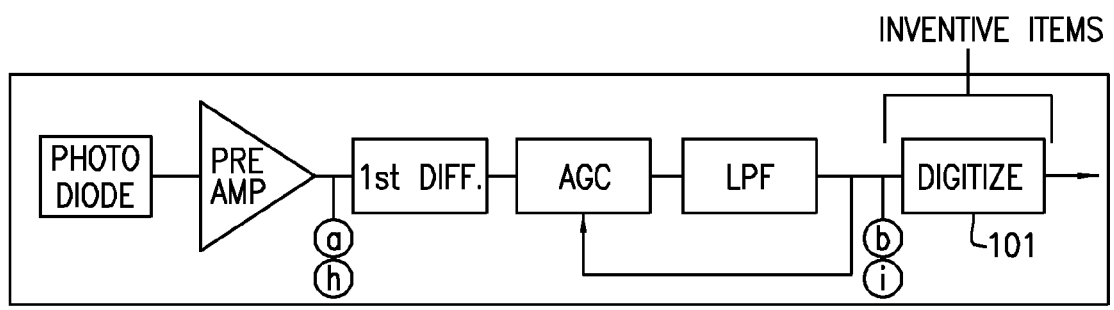
FIG. 1 is a diagram depicting a prior art signal decoding system.
Figure 2:
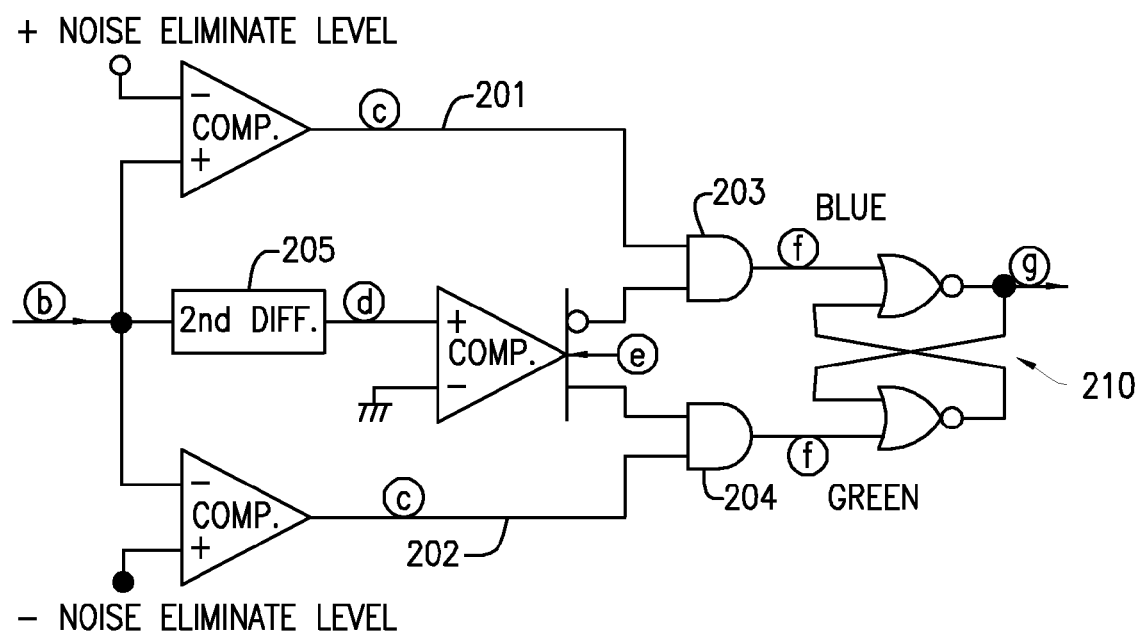
FIG. 2 is a logic diagram showing the internal functions of the digitizer of FIG. 1.
Figure 10:
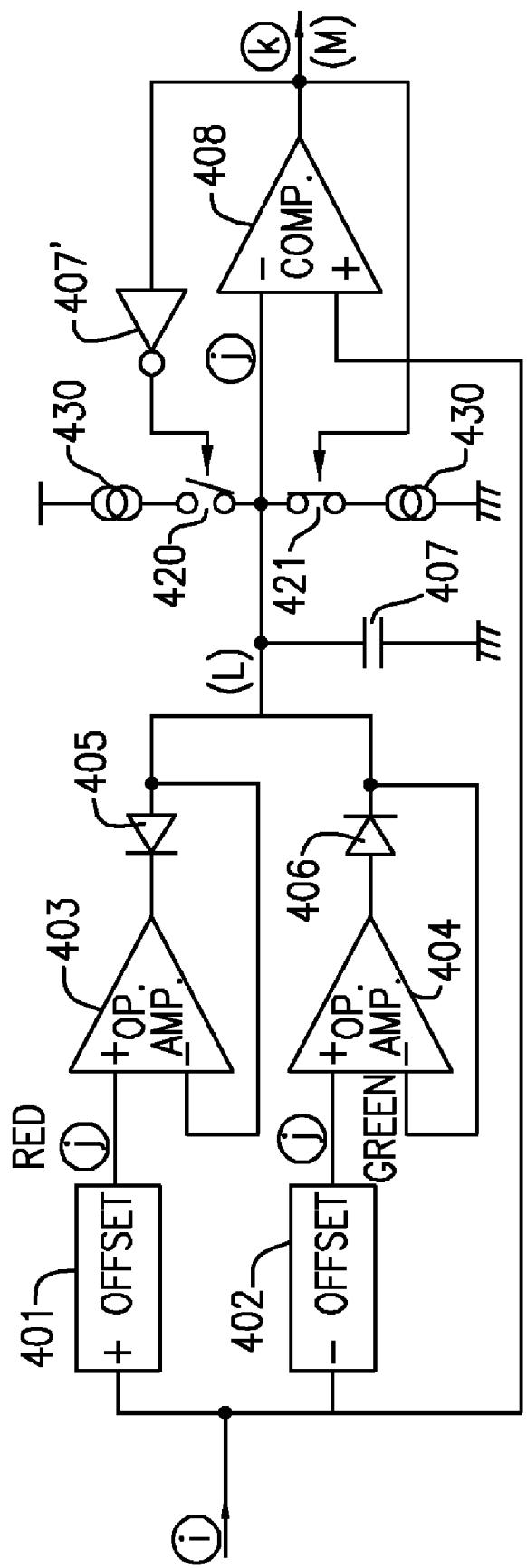
FIG. 10 shows an exemplary embodiment of an analog implementation of the present invention.
Figure 14:
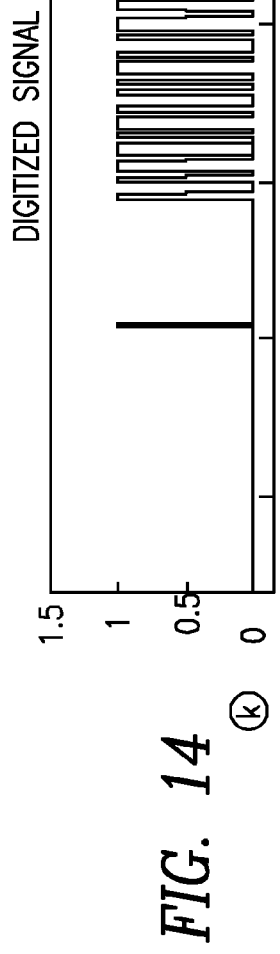
FIG. 14 depicts an exemplary signal at point k of FIG. 10.

FIG. 10 depicts an exemplary embodiment of the invention which comprises two offset blocks 401 and 402 at the input stage. Offsets 401 and 402 produce the signals 501 and 502 as designated in FIG. 13. The arrangement of FIG. 10 is an exemplary analog implementation of the functions discussed herein with respect to the invention, however, the same functionality may be implemented in digital form as shown in FIG. 17.

With respect to the remainder of FIG. 10, we will first describe the circuitry shown and then the signals generated at the various portions thereof, which implement the present invention. Specifically, switches 420 and 421 serve to charge and discharge capacitor 407 respectively. More specifically, when switch 420 is on and switch 421 is off, the voltage on capacitor 407 begins rising. Conversely, when switch 421 is closed and switch 420 is open, a path is provided from capacitor 407 through switch 421 to ground, and capacitor 407 may thus discharge. Element 430 is a current regulator that limits the rate of charging or discharging, and may also be implemented as a resistor or similar component. It is noted that while a capacitor 407 is shown, other charge storage devices may be used without departing from the present invention.

Figure 15:
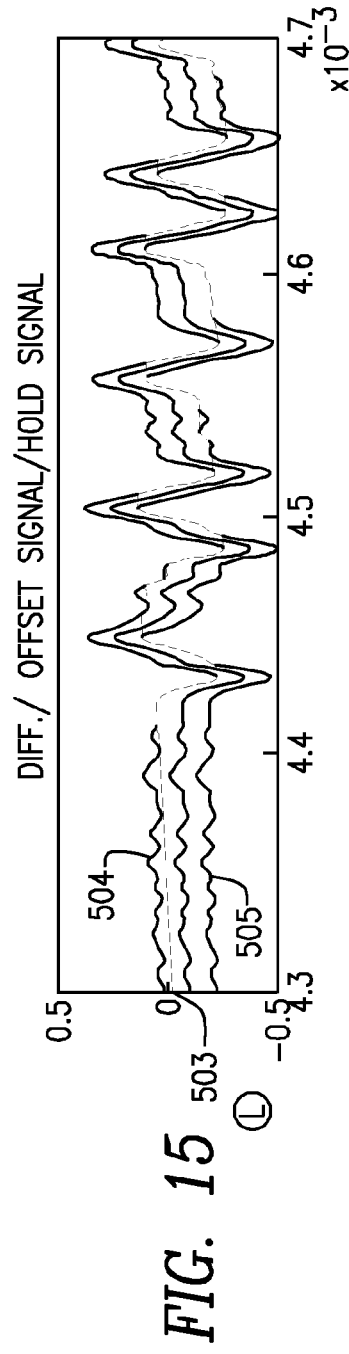
FIG. 15 depicts an exemplary signal at point l of FIG. 10.
Figure 16:
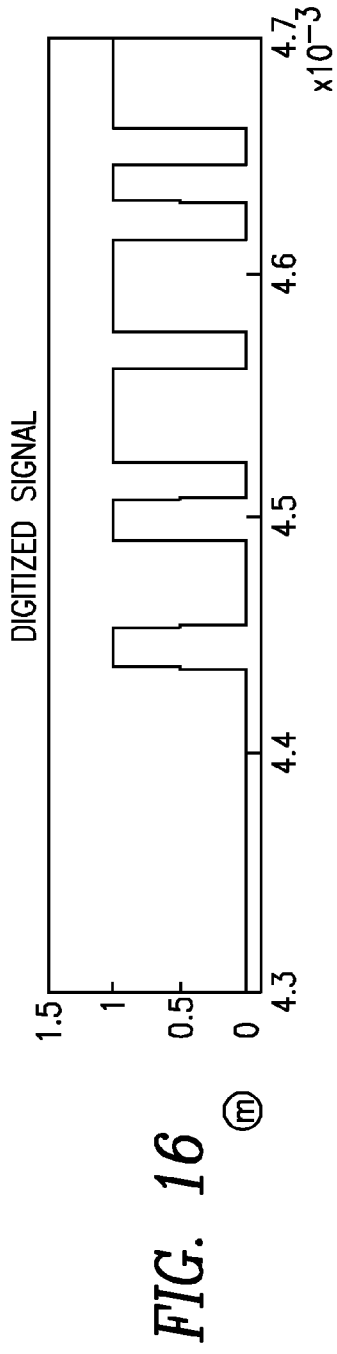
FIG. 16 depicts an exemplary signal at point m of FIG. 10.

The voltage on capacitor 407 is termed a slice signal, and is depicted as 503 in FIG. 15. In operation, the operational amplifiers 404 and 403 serve to generate offset signals that follow the input, and thus which when combined as shown, generate the slice signal designated as 503. The slice signal 503 follows the positive offset signal 504, but is held just below that signal. The slice signal however, does not follow the relatively high frequencies contained within the positive offset signal as shown pictorially in FIG. 13.

The slice signal 503 continues to follow the positive offset signal 504 as that positive offset signal rises. If the input signal crosses over the slice signal, this represents an edge in the barcode pattern. At this point, the output comparator 408 will reconfigure the switches 420 and 421, closing switch 421 and opening switch 420, thereby causing the slice signal to begin decreasing and to tend towards the upper part of the negative offset signal 505 as shown.

Generally, if the slice signal is greater than the input signal, then it follows slowly, at a constant rate, at the lowest level of the positive offset signal 504. However, when the input signal goes above the slice signal, the slice signal then tends toward the positive most portion of the negative offset signal, and follows that negative offset signal at a constant rate. In each case, the relatively high frequencies that do not represent the ambient light are not followed by the slice signal. Each time the slice signal crosses the input signal, a barcode edge is detected.

Because the slice signal follows the slow changes in the input signal, it is not influenced by large ambient light, and thus, can detect the barcode pattern even in the presence of large ambient light.

Figure 17A:
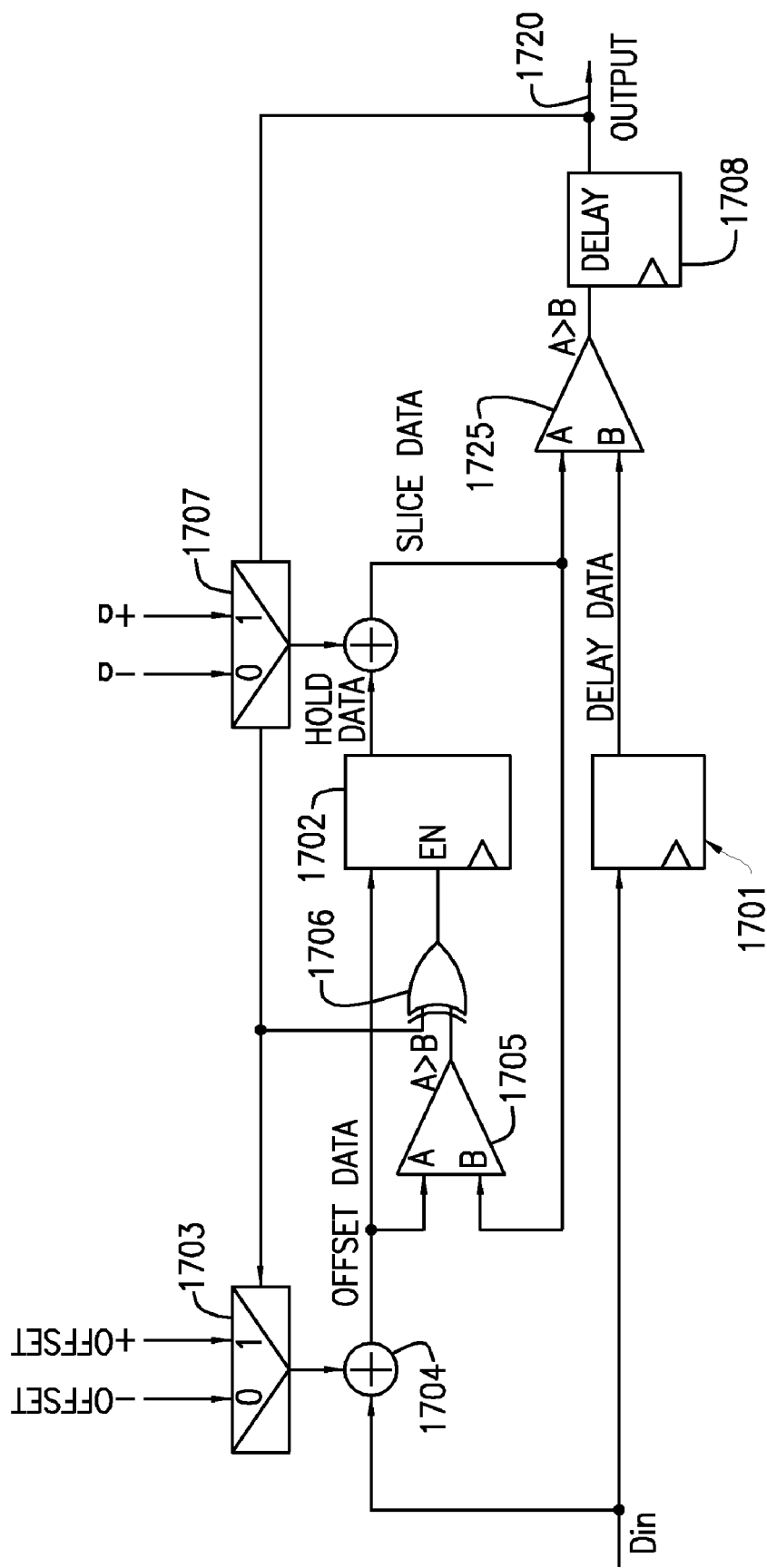
FIGS. 17A and 17B, sometimes also referred to herein as F*ig*. 17, depicts an exemplary digital implementation of the present invention.
Figure 17B:
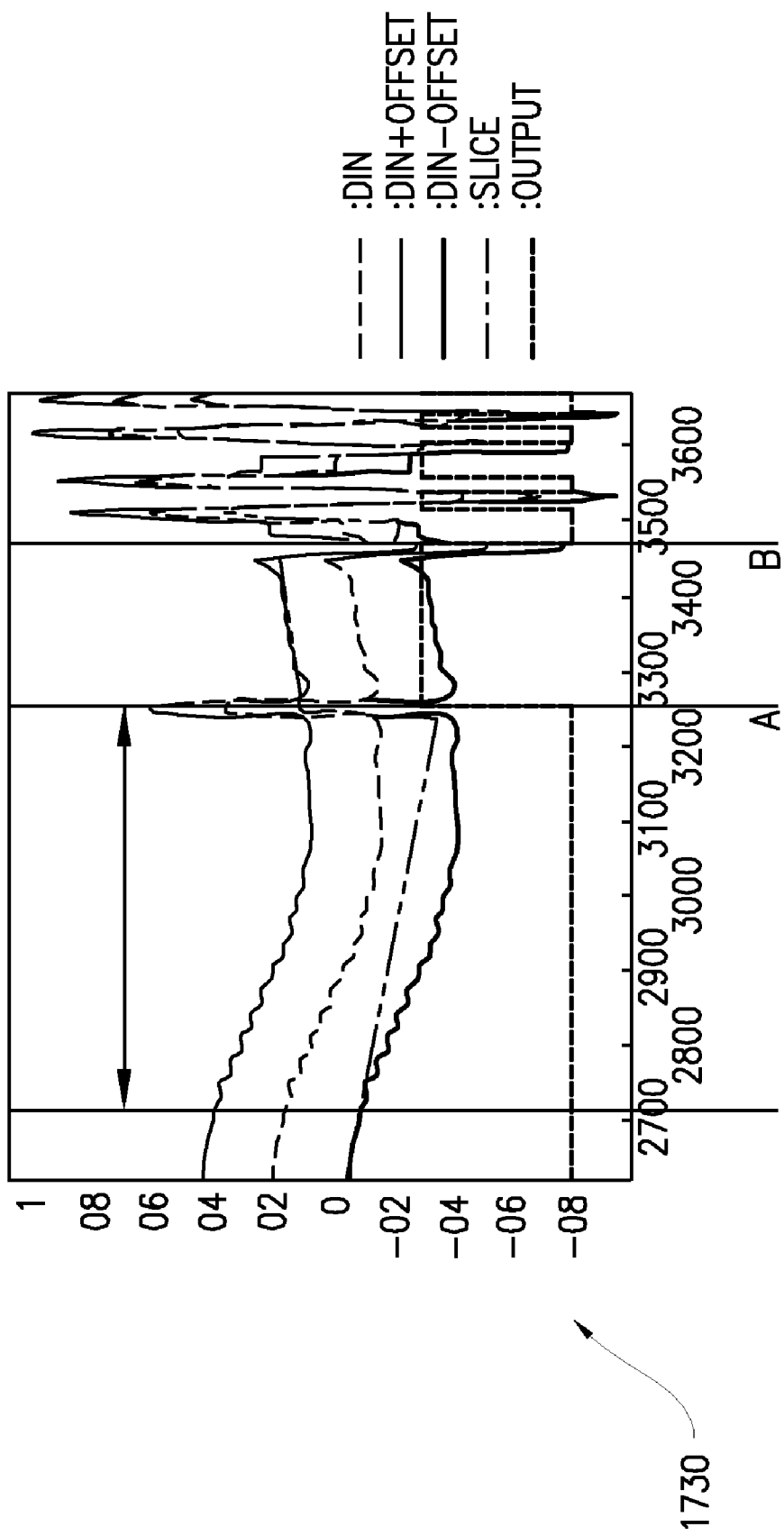

FIG. 17 depicts a digital version of a similar circuit implemented in the analog domain and shown in FIG. 10. The operational amplifiers are replaced with logic gates, and latches are utilized to digitally implement the analog functions. The arrangement of FIG. 17A operates as best shown in the waveform drawing of FIG. 17B. Specifically, the slice data will essentially follow the lower part of the positive offset signal, or the upper part of the negative offset signal, as before. However, the analog components have been replaced with digital domain components as shown, such as latches, delays, and OR function gates.

In operation, Din is added via an adder 1704 to either +offset or −offset, depending upon whether the output 1720 is high or low, respectively. This process creates the digital equivalent of the offset signals shown in FIG. 13. Specifically, the +offset and −offset values are programmable constants, typical values of which are approximately 10-30 percent of the value of the input signal. The Din input to delay 1701 is always a fixed amount separated from the Offset data shown.

Additionally, the selector 1707 adds or subtracts alpha to the HoldData signal as shown. This creates the slice data. When the output is low, the alpha is subtracted from the slice data. This value will be slightly above the offset data signal, resulting in the latch 1702 being disabled. As a result, the same HoldData will remain in the next clock cycle, with the slice data then decrementing by alpha once again. This state will continue, as shown to the left of point A in graph 1730, with the Slice Data thus decrementing substantially linearly while the −offset data stays just below the Slice Data as shown.

When the input rises sharply, such as at point A in graph 1730, the offset data will go above the SliceData, causing comparator 1705 to enable latch 1702 and thus begin increasing the SliceData signal rapidly with each clock cycle. The slice data with then rapidly become larger than the Delay-Data, causing comparator 1725 to reverse the output 1720, making it high. This will cause the remainder of system to operate effectively in reverse to that described. Essentially, the slice data will then slowly and substantially follow the lower bound of the positive offset signal, as shown between points A and B of graph 1730.

It can be appreciated that the digital circuit of FIG. 17 effectively duplicates in the digital domain the operation of the analog circuit of FIG. 10, creating a slice signal that follows the upper bound of the lower offset or lower bound of the upper offset signal as appropriate. The system detects edges when the slice crosses the input signal, Din.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of extracting information out of an input signal, said method comprising generating a positive offset and a negative offset signal and a single slice signal, causing the slice signal to follow the lower bound of the positive offset signal when the input signal is less than the slice signal, causing the slice signal to follow the upper bound of the negative offset signal when the input signal is greater than the slice signal, and signaling the detection of a transition when the slice signal and the input signal cross.

2. The method of claim 1 wherein the slice signal has a lower frequency content than either the positive or negative offset signals.

3. The method of claim 1 wherein the transition comprises going from a light to dark or a dark to light area of the bar code.

4. The method of claim 1 utilized to detect a time varying signal in an environment having a relatively high value noise signal which varies substantially more slowly with time.

5. The method of claim 4 wherein both said time varying signal and said high value noise signal are radiant energy and the noise signal is ambient radiant energy.

6. A circuit for reading a symbol comprising a charge storage device, a first switch, and a second switch, the first switch being arranged to cause charge to accumulate on the charge storage device when said first switch is closed, the second switch being arranged to cause charge to be depleted from said charge storage device when said second switch is closed;

an offset signal generating circuit for accepting an input signal and generating both positive and negative offset signals from said input signal, said positive and negative offset signals having relatively high frequency components that vary between upper and lower bounds a slice signal generating circuit, operatively coupled to said first and second switches, to cause the first and second switches to close and open at appropriate times, such that a single slice signal substantially follows said lower bound of said positive offset signal when said input signal is less than said slice signal, and such that said slice signal substantially follows said upper bound of said negative offset signal when said input signal is greater than said slice signal.

7. The circuit of claim 6 wherein said charge storage device is a capacitor.

8. The circuit of claim 7 wherein each of said offset signals is input to a separate operational amplifier.

9. The circuit of claim 6 further comprising an edge detector for determining that an edge in a symbol being read is present whenever said slice signal and said input signal cross over each other.

10. A circuit for extracting information from a symbol, said circuit comprising at least one logic gate and at least two comparators, said circuit being configured to accept a digital input signal and generate a digital positive offset signal and a digital negative offset signal, and a slice signal, said slice signal remaining just above said negative offset signal when said digital input signal is greater than said slice signal, and moving to just below said positive offset signal when said slice signal crosses said input signal.

11. The circuit of claim 10 further comprising at least one digital delay component.

12. A circuit comprising a selector for generating positive and negative offset signals, and a slice generating circuit for generating a slice signal that follows said negative offset signal more slowly when said negative offset signal is decreasing than it does when said negative offset signal is increasing, and which follows said positive offset signal more slowly when increasing than it does when said positive offset signal is decreasing.

13. The circuit of claim 12 wherein a rate at which said slice signal follows either one of said offset signal is altered by enabling a latch.

14. The circuit of claim 12 wherein the output changes state and detects and edge when an offset signal crosses said slice signal.

* * * * *